US012000584B2

(12) United States Patent
Konishi

(10) Patent No.: US 12,000,584 B2
(45) Date of Patent: Jun. 4, 2024

(54) LIGHT-EMITTING DEVICE

(71) Applicant: DENKA COMPANY LIMITED, Tokyo (JP)

(72) Inventor: Masahiro Konishi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 18/022,713

(22) PCT Filed: Aug. 5, 2021

(86) PCT No.: PCT/JP2021/029137
§ 371 (c)(1),
(2) Date: Feb. 22, 2023

(87) PCT Pub. No.: WO2022/044762
PCT Pub. Date: Mar. 3, 2022

(65) Prior Publication Data
US 2023/0313973 A1    Oct. 5, 2023

(30) Foreign Application Priority Data

Aug. 26, 2020  (JP) ................................. 2020-142373

(51) Int. Cl.
| F21V 9/30 | (2018.01) |
| F21V 19/00 | (2006.01) |
| F21V 23/06 | (2006.01) |
| F21V 29/76 | (2015.01) |
| F21Y 105/18 | (2016.01) |
| F21Y 113/13 | (2016.01) |
| F21Y 115/10 | (2016.01) |

(52) U.S. Cl.
CPC ............ *F21V 9/30* (2018.02); *F21V 19/0015* (2013.01); *F21V 23/06* (2013.01); *F21V 29/763* (2015.01);
(Continued)

(58) Field of Classification Search
CPC ............. F21Y 2105/18; F21Y 2105/10; F21Y 2105/12; F21Y 2105/14; F21Y 2105/16; F21V 9/32
See application file for complete search history.

(56) References Cited

U.S. PATENT DOCUMENTS

| 9,082,940 B2 | 7/2015 | Ebe et al. |
| 9,768,151 B2 | 9/2017 | Kuriki |

(Continued)

FOREIGN PATENT DOCUMENTS

| CN | 204901678 U | 12/2015 |
| CN | 106163113 A | 11/2016 |

(Continued)

OTHER PUBLICATIONS

Oct. 19, 2021 International Search Report issued in International Patent Application No. PCT/JP2021/029137.

(Continued)

*Primary Examiner* — Sean P Gramling
(74) *Attorney, Agent, or Firm* — Oliff PLC

(57) ABSTRACT

A light-emitting device has a light-emitting substrate having a circuit pattern layer over one surface of an insulating substrate and a plurality of light-emitting elements bonded to the circuit pattern layer, the light-emitting substrate has a phosphor layer on one surface side of the insulating substrate and includes a phosphor wherein the light emission peak wavelength is in a visible light region when the light emission of at least one of the light-emitting elements is used as excitation light, the elements have a plurality of serial bodies wherein the light-emitting elements are connected in series and arranged in parallel from an inner to an outer side of the substrate surface when the substrate surface of the light-emitting substrate is viewed from a top surface, and anode sides of the serial bodies are arranged on the same (Continued)

side of either the inner or the outer side of the substrate surface.

11 Claims, 8 Drawing Sheets

(52) U.S. Cl.
CPC ....... *F21Y 2105/18* (2016.08); *F21Y 2113/13* (2016.08); *F21Y 2115/10* (2016.08)

(56) References Cited

U.S. PATENT DOCUMENTS

| | | |
|---|---|---|
| 10,056,358 B2 | 8/2018 | Kuriki |
| 2014/0001656 A1 | 1/2014 | Ebe et al. |
| 2017/0194297 A1 | 7/2017 | Kuriki |
| 2017/0211761 A1* | 7/2017 | Kuriki .................... F21V 29/89 |
| 2017/0330869 A1 | 11/2017 | Kuriki |

FOREIGN PATENT DOCUMENTS

| | | |
|---|---|---|
| JP | 2004-319595 A | 11/2004 |
| JP | 2012-119281 A | 6/2012 |
| JP | 2014-143307 A | 8/2014 |
| JP | 2014-168036 A | 9/2014 |
| JP | 2017-085096 A | 5/2017 |

OTHER PUBLICATIONS

Apr. 2, 2024 Office Action issued in Japanese Patent Application No. 2022-545609.

* cited by examiner

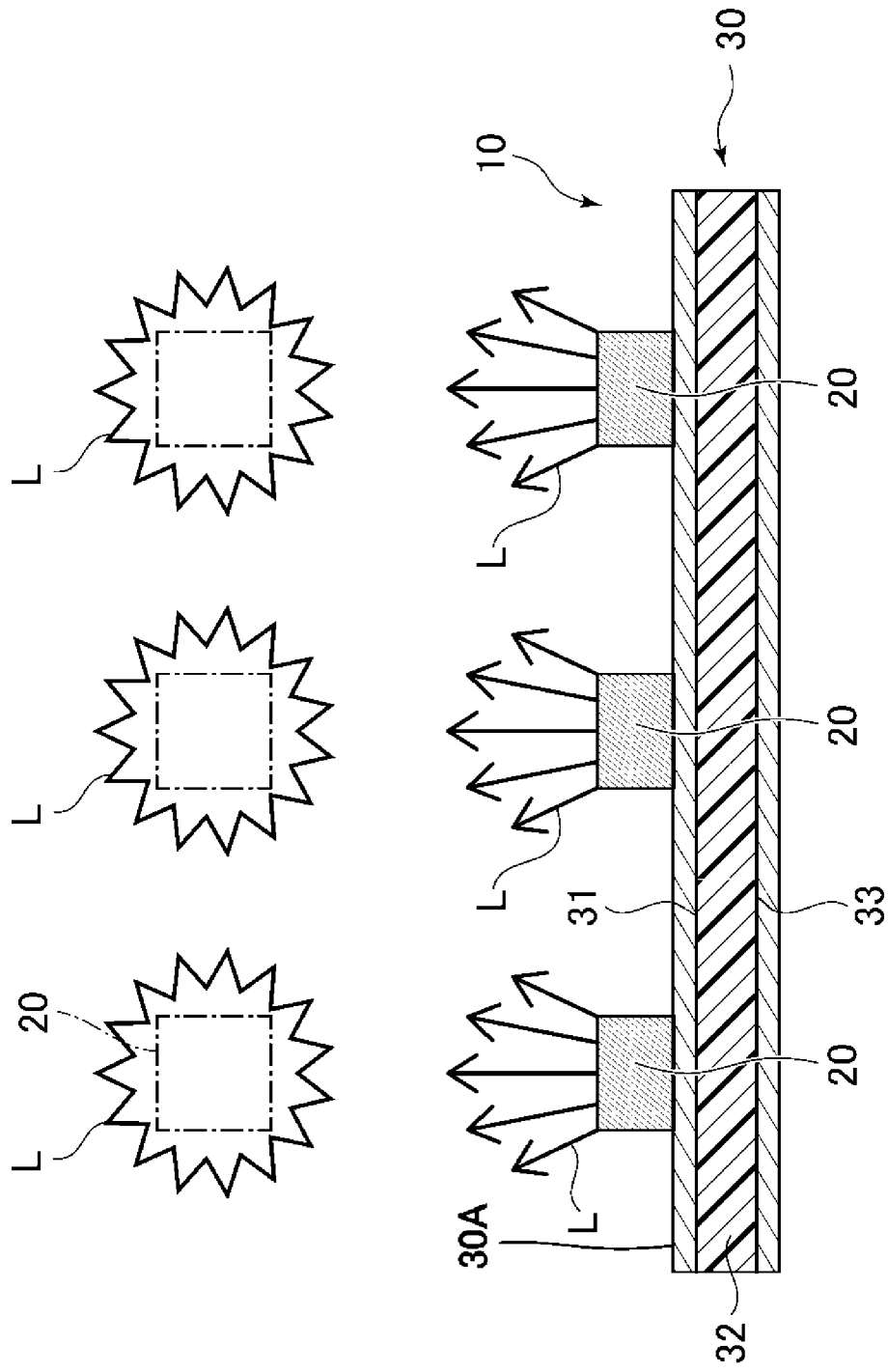

LIGHT-EMITTING DEVICE

TECHNICAL FIELD

The present invention relates to a light-emitting device.

BACKGROUND ART

Patent Document 1 discloses a light-emitting diode (LED) lighting fixture provided with a substrate on which a light-emitting element (LED element) is mounted.

RELATED DOCUMENT

Patent Document

[Patent Document 1] Chinese Patent Publication No. 106163113

SUMMARY OF THE INVENTION

Technical Problem

For example, in the case of the LED lighting fixture in Patent Document 1, there was no disclosure regarding a lighting technique for efficiently emitting light from a plurality of light-emitting elements and there was a demand for new techniques.

The present invention has an object of providing a technique for efficiently emitting light in a light-emitting device provided with a light-emitting substrate having an insulating substrate and a plurality of light-emitting elements and for realizing, for example, a high-output lighting device.

Solution to Problem

The light-emitting device of the present invention has a light-emitting substrate having a circuit pattern layer provided over one surface of an insulating substrate and a plurality of light-emitting elements bonded to the circuit pattern layer, in which
  the light-emitting substrate has a phosphor layer which is provided on one surface side of the insulating substrate and which includes a phosphor in which a light emission peak wavelength is in a visible light region when light emitted from at least one of the light-emitting elements is used as excitation light,
  the plurality of the light-emitting elements have a plurality of serial bodies in which the plurality of the light-emitting elements are connected in series,
  the plurality of the serial bodies are arranged in parallel from an inner side of a substrate surface to an outer side of the substrate surface when the substrate surface of the light-emitting substrate is viewed from a top surface, and
  anode sides of the plurality of the serial bodies are arranged on the same side as either the inner side of the substrate surface or the outer side of the substrate surface.

Advantageous Effects of Invention

It is possible to efficiently emit light in a light-emitting device provided with a light-emitting substrate having an insulating substrate and a plurality of light-emitting elements and to realize, for example, a high-output lighting device.

BRIEF DESCRIPTION OF THE DRAWINGS

FIG. 8 is a diagram which illustrates a light-emitting operation of a light-emitting substrate of a comparative form.

DESCRIPTION OF EMBODIMENTS

<Overview>

A description will be given below of the present embodiment with reference to FIG. 1 to FIG. 7. First, a description will be given of the functions and configuration of a light-emitting device 100 of the present embodiment with reference to FIG. 1 and FIG. 5. Next, a description will be given of a light-emitting operation of the light-emitting device 100 of the present embodiment with reference to FIG. 3. Next, a description will be given of the effects of the present embodiment.

<Functions and Configuration of Light-Emitting Device>

Figure 1:
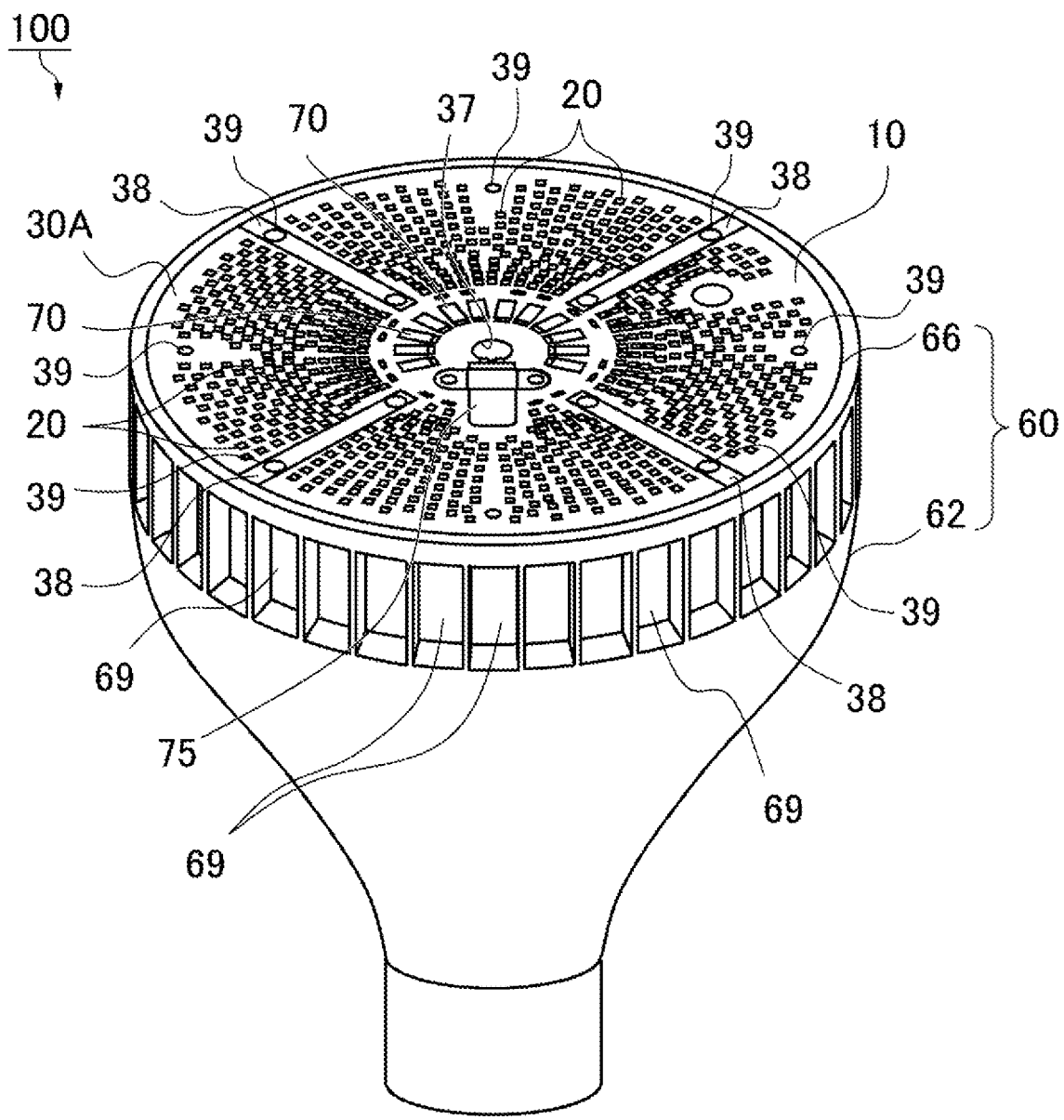
FIG. 1 is a schematic diagram of a light-emitting device of an embodiment.
Figure 2:
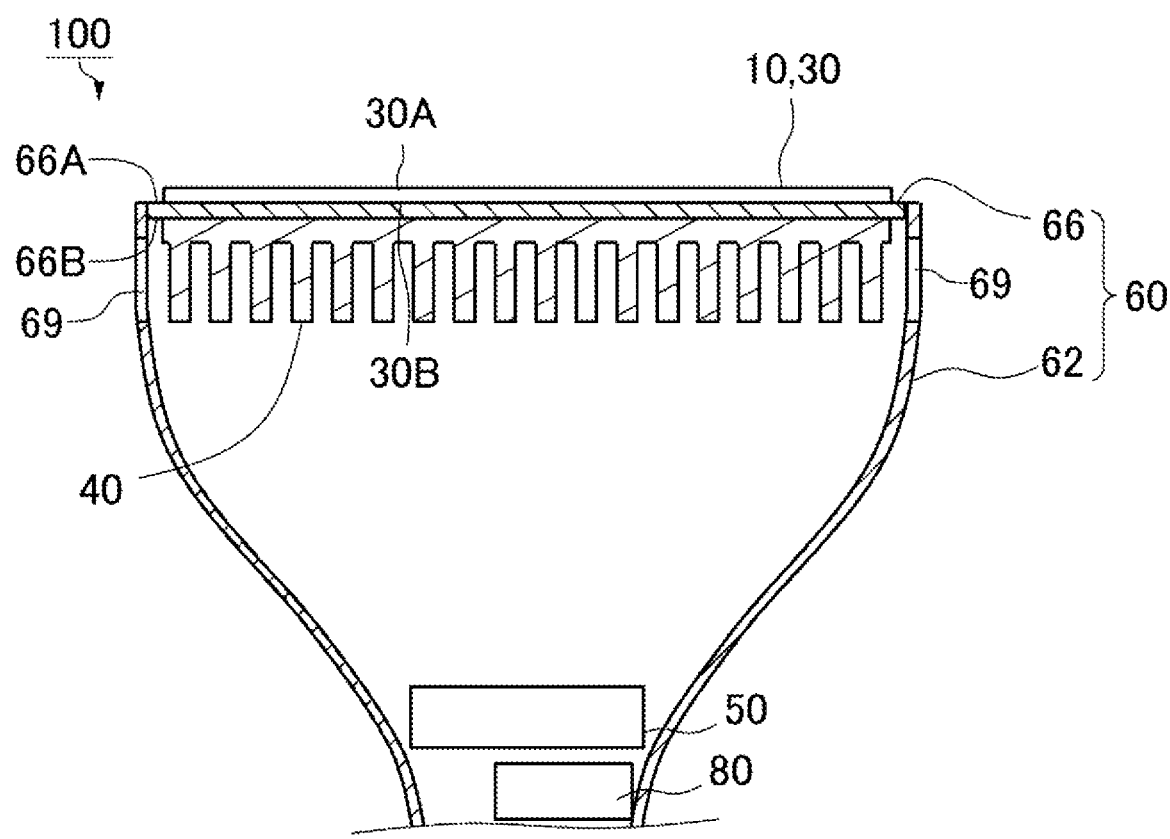
FIG. 2 is a diagram showing a simplified internal structure of the light-emitting device of the embodiment.

FIG. 1 is a perspective view of the light-emitting device 100 of the present embodiment and FIG. 2 is a cross-sectional view schematically showing the internal structure thereof.

The light-emitting device 100 is formed with a substantially conical or cylindrical shape overall and, for example, is used as a high-output lighting device used for stadium lighting or exterior lighting of large-scale buildings (so-called tower lighting).

The light-emitting device 100 has a light-emitting substrate 10, a heat-dissipating unit (a heat sink 40 and a cooling fan 50), a housing 60 (enclosure), and a drive control circuit 80 (a power conversion unit, a drive IC, a switch unit, and the like). Here, the light-emitting substrate 10, the heat-dissipating unit (the heat sink 40 and the cooling fan 50), and the drive control circuit 80 are stored in the housing 60.

The housing 60 is formed to include a conical peripheral wall 62 and a top wall 66 formed of a material with good thermal conductivity (for example, aluminum alloy or the like) as an example. The peripheral wall 62 is provided with cooling openings 69 which are arranged in the circumferential direction in the vicinity of the upper end side and which connect the inside and outside of the housing 60. A transparent or white cover covering the light-emitting substrate 10 is provided as a constituent element of the housing 60, but is not shown here.

The light-emitting substrate 10 is shown here with a substantially circular shape when viewed from the top surface. The light-emitting substrate 10 is arranged on a top surface 66A of the top wall 66. The light-emitting substrate 10 is screw-fixed to the top surface 66A of the top wall 66, for example, at through holes 39 provided in the vicinity of the periphery.

[Heat-Dissipating Unit (Heat Sink 40, Cooling Fan 50)

The heat sink 40 is arranged on an inner surface 66B of the top wall 66, more specifically, at a portion on the opposite side (the lower side direction in the diagram) of the light-emitting substrate 10, interposing the top wall 66 therebetween. The heat sink 40 has a plurality of fins extending in the lower side direction.

The cooling fan 50 is arranged inside the housing 60, on the opposite side (the lower side in the diagram) of the light-emitting substrate 10, interposing the heat sink 40 therebetween. The cooling fan 50 is arranged inside the housing 60 to be opposite the light-emitting substrate 10, such that, during the light-emitting operation of the light-emitting device 100, the air flow generated by the power supply from the power source (for example, the drive control circuit 80) hits the heat sink 40 and is discharged through the cooling openings 69.

[Light-Emitting Substrate 10]

Figure 3:
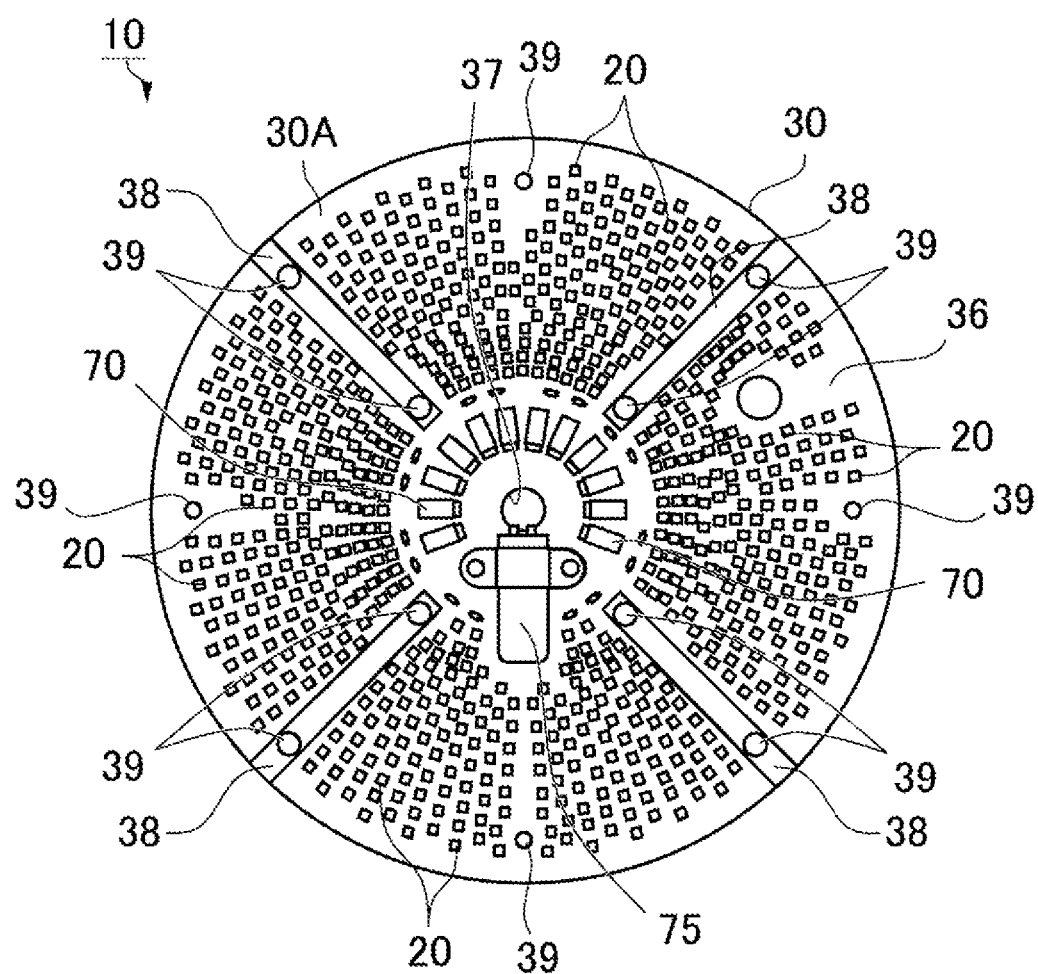
FIG. 3 is a plan view of a light-emitting substrate of the embodiment.
Figure 4:
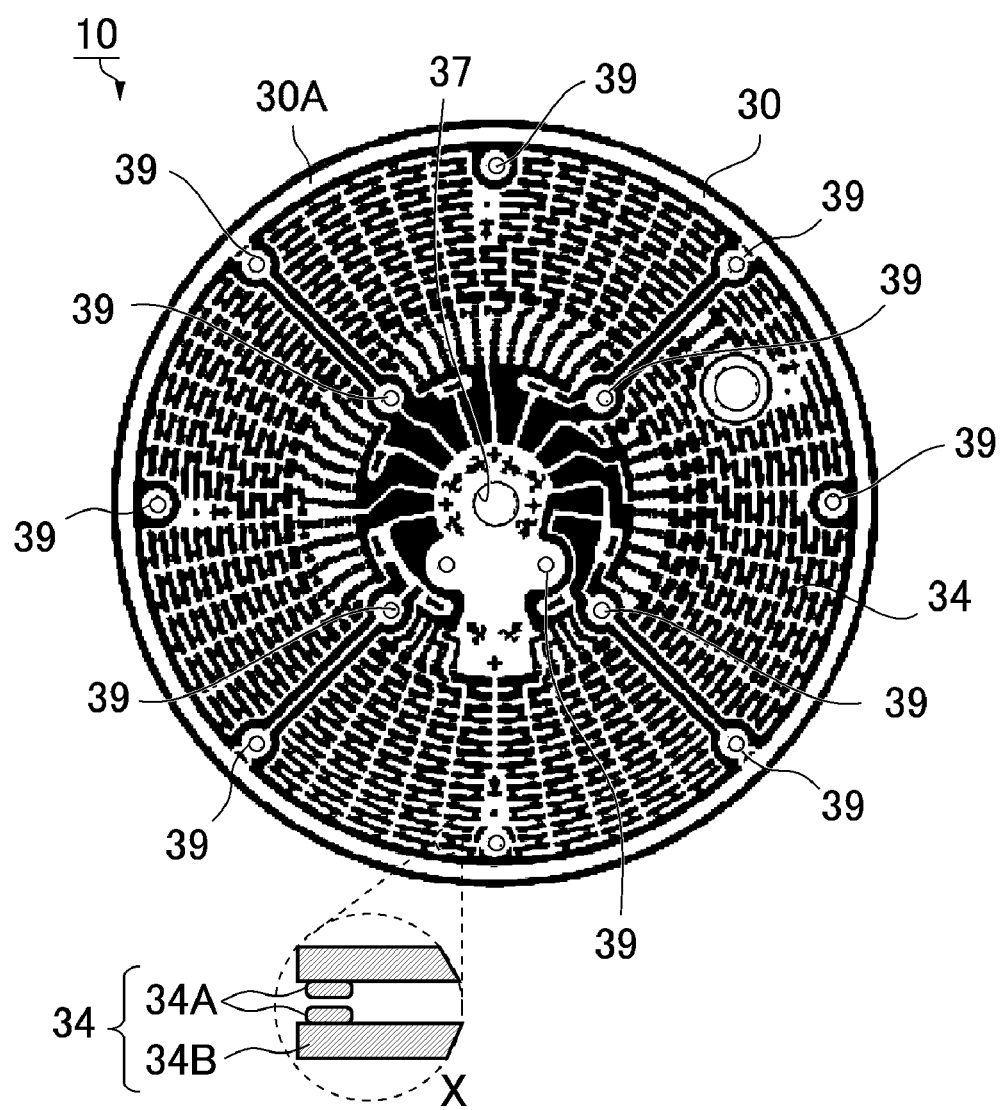
FIG. 4 is a plan view of the light-emitting substrate of the embodiment in which the exposed circuit pattern layer is shown.
Figure 5:
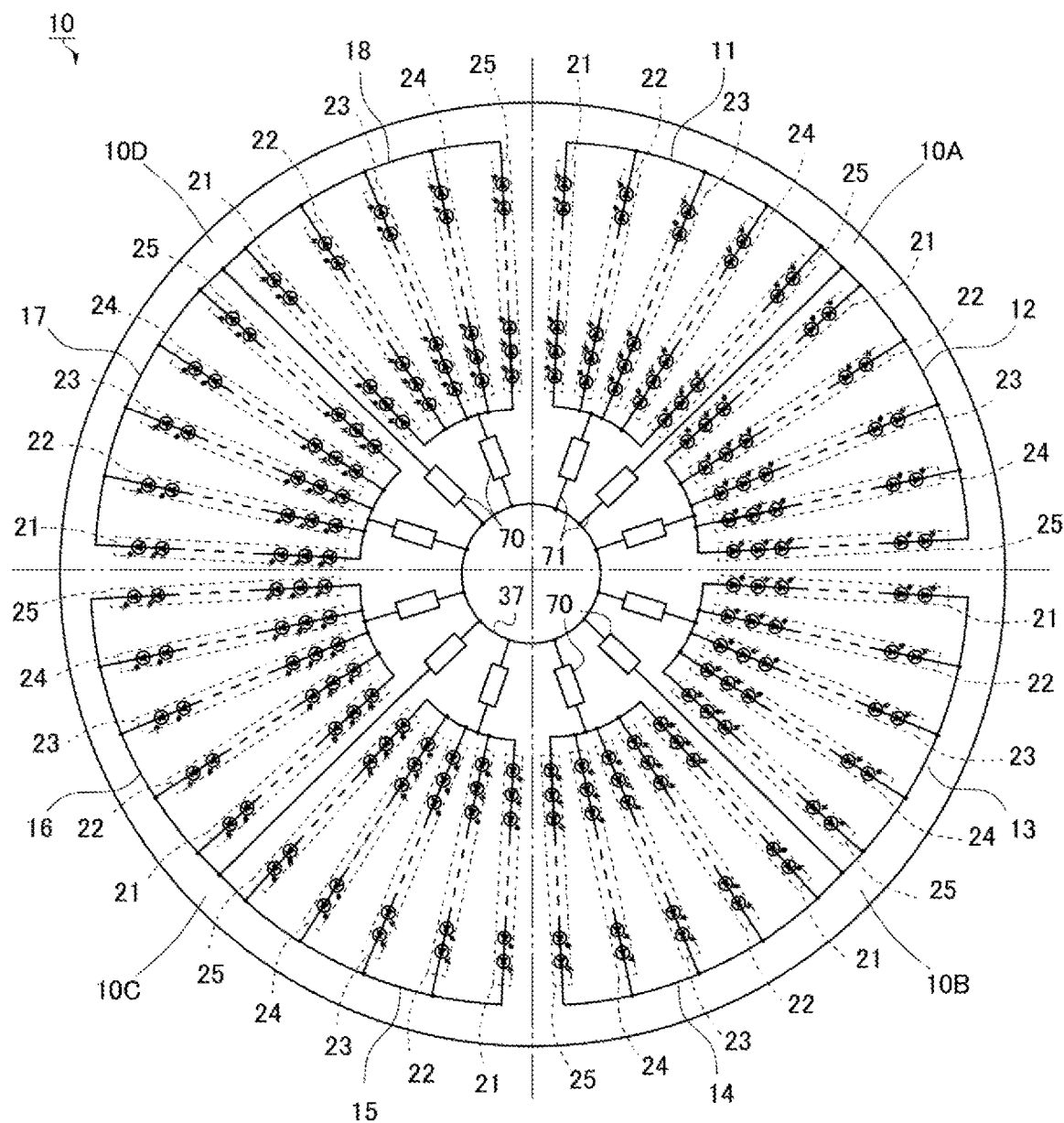
FIG. 5 is a circuit diagram schematically showing the connection form of the light-emitting elements of the embodiment.

Next a description will be given of the light-emitting substrate 10, primarily with reference to FIG. 3 to FIG. 5. FIG. 3 is a top surface view of the light-emitting substrate 10 viewed from the side of a surface 30A. FIG. 4 is a top surface view of the light-emitting substrate 10 in a state where light-emitting elements 20 and a phosphor layer 36 are omitted from the light-emitting substrate 10 in FIG. 3, that is, showing the exposed circuit pattern layer. FIG. 5 is a diagram schematically showing the arrangement of the light-emitting elements 20 on the light-emitting substrate 10 so as to clarify the connection form (circuit state), in other words, a simplified diagram of the light-emitting substrate 10 in FIG. 3, in which some constituent elements (a temperature sensor 75, substrate holding bars 38, and the like) are not shown.

As shown in FIG. 3, viewed from the surface 30A side and a rear surface 30B side, that is, from the substrate thickness direction, the light-emitting substrate 10 is circular as an example.

The light-emitting substrate 10 has a plurality of the light-emitting elements 20, a phosphor substrate 30, a plurality of connectors 70, the temperature sensor 75, and electronic components (not shown) such as a driver IC. That is, the plurality of the light-emitting elements 20 and the electronic components described above are mounted on the phosphor substrate 30.

The drive control circuit 80 is, for example, provided to be adjacent to the cooling fan 50 and causes the light-emitting elements 20 connected by lead wires 71 (refer to FIG. 5) to be driven to emit light under PWM control. In addition, the drive control circuit 80 also acquires a signal from the temperature sensor 75 and performs driving control of the cooling fan 50 to carry out control in the desired temperature range.

A through hole of a predetermined diameter (below, a "central open hole 37") is provided in the approximate center of the light-emitting substrate 10. On the periphery of the central open hole 37, a plurality of the connectors 70 (here, twelve) and the temperature sensor 75 are provided to surround the central open hole 37. Through the central open hole 37, the lead wires 71 for supplying power to the light-emitting elements 20 and the signal wires of the temperature sensor 75 are connected to the drive control circuit 80.

As shown in FIG. 1 and FIG. 2, the light-emitting substrate 10 is fixed to the top wall 66 by bringing the rear surface thereof into contact with the top surface 66A of the top wall 66, which forms part of the housing 60.

[Plurality of Light-Emitting Elements 20]

The plurality of the light-emitting elements 20 are each, as an example, a Chip Scale Package (CSP) in which a flip chip LED (not shown) is incorporated. The plurality of the light-emitting elements 20 are mounted on the phosphor substrate 30 in a state of being regularly lined up over the entire surface 30A of the light-emitting substrate 10 (the phosphor substrate 30), as shown in FIG. 3, for example.

Here, the plurality of the light-emitting elements 20 are arranged in a radial shape. A description will be given below of more specific connection forms, but serial bodies in which the plurality of the light-emitting elements 20 are connected in series are formed to be lined up in a plurality of parallel rows and these serial bodies are arranged in a radial shape.

The correlated color temperature of the light emitted by each of the light-emitting elements 20 is 6,000 K as an example. In the present embodiment, the heat sink 40 and cooling fan 50 are used to dissipate heat of (cool) the phosphor substrate 30 to a range of a normal temperature (for example, 25° C.) to 100° C. as an example during the light-emitting operation of the plurality of the light-emitting elements 20.

Here, to further explain the meaning of "to" used for numerical value ranges in the present specification, for example, "50° C. to 100° C." means "50° C. or higher and 100° C. or lower". That is, "to" used for numerical value ranges in the present specification means "the portion described before 'to' or more and the portion described after 'to' or less".

[Connection Form of Plurality of Light-Emitting Elements 20]

Figure 6:
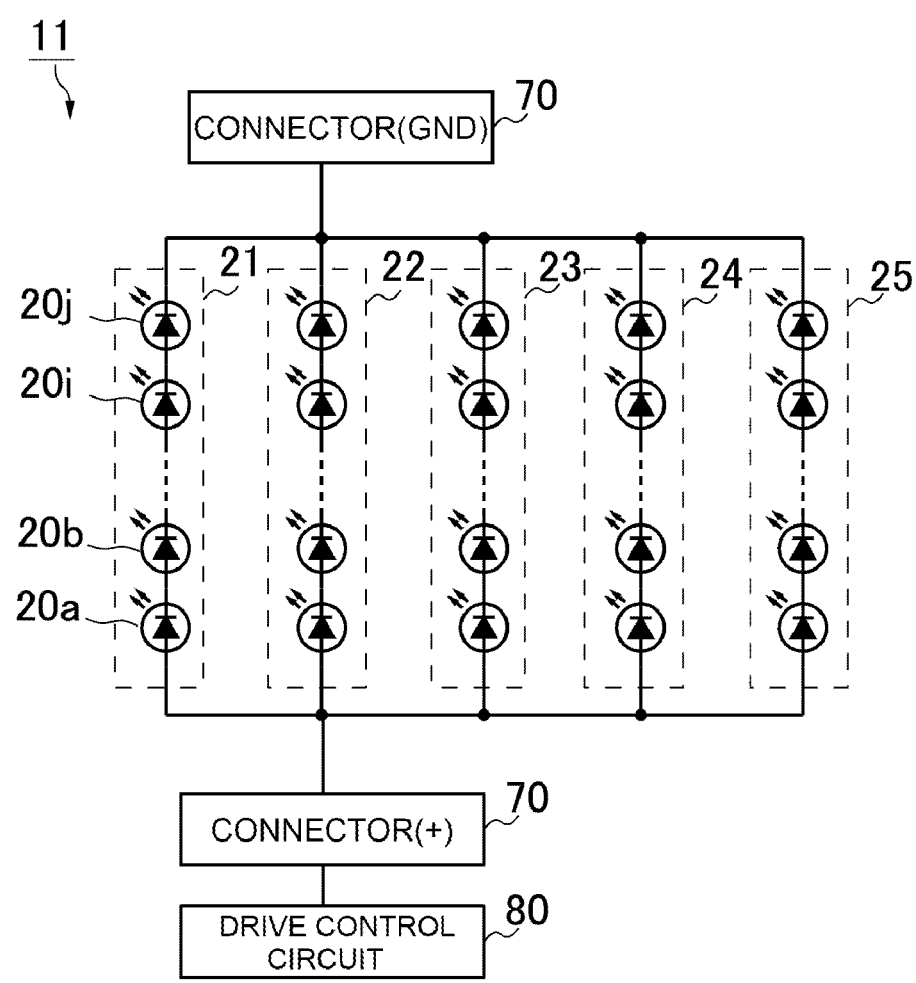
FIG. 6 is a circuit diagram of a first parallel body of the embodiment.

Referring to FIGS. 3, 5 and 6, a description will be given of the connection form of the light-emitting elements 20. In addition, FIG. 6 is a diagram showing a view of a partial region (one parallel body) of FIG. 5.

The plurality of the light-emitting elements 20 are regularly lined up over the entire surface 31 side of the insulating substrate 32. More specifically, serial bodies in which a plurality of the light-emitting elements 20 are connected in series are arranged such that the anode sides are on the connector 70 side and the ground (GND) sides are on the outer circumference side.

In the present embodiment, a parallel body in which the plurality of the serial bodies are connected in parallel is provided. A plurality of parallel bodies are provided over the phosphor substrate 30.

A more detailed description will be given. As shown in FIG. 5, for convenience, description will be given with the region of the light-emitting substrate 10 divided into four equal parts as first to fourth substrate regions 10A to 10D in the circumferential direction viewed from the top surface.

Each of the first to fourth substrate regions 10A to 10D has two parallel bodies and three connectors 70 that supply power thereto. That is, overall, eight parallel bodies are provided (in FIG. 5, first to eighth parallel bodies 11 to 18). Each parallel body has a similar connection form (circuit configuration).

Specifically, the first parallel body 11 and the second parallel body 12 are provided in the first substrate region 10A. The anode side (here, the central open hole 37 side) of the first parallel body 11 is connected to the connector 70(+). Similarly, the anode side of the second parallel body 12 is connected to the connector 70(+). In addition, the ground (GND) sides of the first parallel body 11 and the second parallel body 12 are routed from the outer circumference side to the center side (the central open hole 37 side) by a grounding pattern provided in the circuit pattern layer 34 and are connected to the connector 70 (GND).

Similarly, the third parallel body 13 and the fourth parallel body 14 are provided in the second substrate region 10B. The anode side (here, the central open hole 37 side) of the third parallel body 13 is connected to the connector 70(+). The anode side of the fourth parallel body 14 is connected to the connector 70(+). In addition, the ground (GND) sides of the third parallel body 13 and the fourth parallel body 14 are routed from the outer circumference side to the center side (the central open hole 37 side) by the grounding pattern provided in the circuit pattern layer 34 and are connected to the connector 70 (GND).

Similarly, the fifth parallel body 15 and the sixth parallel body 16 are provided in the third substrate region 10C. The anode side (here, the central open hole 37 side) of the fifth parallel body 15 is connected to the connector 70(+). The anode side of the sixth parallel body 16 is connected to the connector 70(+). In addition, the ground (GND) sides of the fifth parallel body 15 and the sixth parallel body 16 are routed from the outer circumference side to the center side (the central open hole 37 side) by the grounding pattern provided in the circuit pattern layer 34 and are connected to the connector 70 (GND).

Similarly, the seventh parallel body 17 and the eighth parallel body 18 are provided in the fourth substrate region 10D. The anode side (here, the central open hole 37 side) of the seventh parallel body 17 is connected to the connector 70(+). The anode side of the eighth parallel body 18 is connected to the connector 70(+). In addition, the ground (GND) sides of the seventh parallel body 17 and the eighth parallel body 18 are routed from the outer circumference side to the center side (the central open hole 37 side) by the grounding pattern provided in the circuit pattern layer 34 and are connected to the connector 70 (GND).

The lead wire 71 is connected to the connector 70(+) and is connected to the drive control circuit 80 described above through the central open hole 37. In addition, the lead wire 71 is connected to the connector 70 (GND), which is connected to a predetermined ground (GND).

Next, with reference to FIG. 6, a description will be given of the connection form of the parallel bodies. The first to eighth parallel bodies 11 to 18 have the same connection form (circuit configuration) and the first parallel body 11 will be described below as a representative thereof.

The first parallel body 11 has the plurality of the serial bodies connected in parallel, more specifically, first to fifth serial bodies 21 to 25. The anode sides of the first to fifth serial bodies 21 to 25 are connected to the connector 70(+). The cathode sides of the first to fifth serial bodies 21 to 25 are connected to the ground (GND) through the connector 70 (GND).

The first to fifth serial bodies 21 to 25 have the same connection form (circuit configuration). Specifically, the first serial body 21 has a configuration in which a plurality of the light-emitting elements 20, here, first to tenth light-emitting elements 20a to 20j, are connected in series. The second to tenth serial bodies also each similarly have a configuration in which the first to tenth light-emitting elements 20a to 20j are connected in series.

In each of the first to fifth serial bodies 21 to 25, the first to tenth light-emitting elements 20a to 20j are arranged over an approximately straight line from the circle center side (the central open hole 37 or the connector 70 side) to the outer circumference side. However, the arrangement of the first to tenth light-emitting elements 20a to 20j need not be completely linear and may be partially or fully in a zigzag shape such that the light intensity distribution over the phosphor substrate 30 is optimized. In other words, a plurality of the light-emitting elements 20 (the first to tenth light-emitting elements 20a to 20j) may be connected such that the anode side of each serial body (that is, the first to fifth serial bodies 21 to 25) is on the circle center side (the central open hole 37 side) and the cathode side (GND side) is on the circumferential edge side.

The color of the emitted light of the light-emitting elements 20 may be different for each serial body or each parallel body. When the drive control circuit 80 drives the light emission of the light-emitting elements 20, it is possible to adjust the output for each serial body or each parallel body (for each body connected to the same connector 70) and to adjust the timing of the light emission to enable a variety of types of light and tone adjustment.

[Phosphor Substrate 30]

The phosphor substrate 30 has the insulating substrate 32, the circuit pattern layer 34, the phosphor layer 36, and a rear surface pattern layer (not shown) (refer to, for example, FIG. 3 and FIG. 4). Although the phosphor layer 36 is not shown in FIG. 4, as shown in FIG. 3, the phosphor layer 36, as an example, is arranged on the surface 31 of the insulating substrate 32 so as to cover the portions in the circuit pattern layer 34 other than the electrical connection portions with the electrode pairs 34A (refer to the inside of the enlarged circle X in FIG. 4) and the connectors 70 and the electrical connection portion with the temperature sensor 75. In other words, when the phosphor substrate 30 is viewed from the top surface, the phosphor layer 36 is provided over the entire surface except for the regions where the constituent elements such as the light-emitting elements 20 and the connectors 70 are provided over the substrate.

The phosphor substrate 30 is provided with a plurality of the through holes 39 (here, eight) equally spaced in the circumferential direction in the vicinity of the outer edge. In addition, a plurality (four) of the through holes 39 are provided to be equally spaced in the circumferential direction in the vicinity of the central open hole 37 (more specifically, in the vicinity of the outer circumference side of the connectors 70). By these through holes 39, the phosphor substrate 30 (that is, light-emitting substrate 10) is fixed to the housing 60 and the substrate holding bars 38 for preventing substrate warpage/floating are also attached, as shown in FIG. 3.

The phosphor substrate 30 in the present embodiment is manufactured by processing (etching or the like) a mother board with copper foil layers provided over both surfaces of the insulating substrate 32, as described below, and the mother board is, as an example, the CS-3305A manufactured by Risho Kogyo Co., Ltd.

[Insulating Substrate 32]

As an example, the insulating substrate 32 has the following characteristics. The shape is, as described above, circular as viewed from the surface 31 side and a rear surface 33 side as an example. The material is an insulating material including bismaleimide resin and glass cloth as an example. The thickness is 100 μm as an example.

The coefficients of thermal expansion (CTE) in the longitudinal direction and lateral direction are each, as an example, 10 ppm/° C. or less in a range of 50° C. to 100° C. In addition, from another viewpoint, the coefficients of thermal expansion (CTE) in the longitudinal direction and lateral direction are each 6 ppm/° C., as an example. This value is almost equivalent (90% to 110%, that is, within ±10%) to that in the case of the light-emitting elements 20 of the present embodiment.

The glass transition temperature is, as an example, higher than 300° C.

The storage modulus is, as an example, greater than $1.0\times10^{10}$ Pa and less than $1.0\times10^{11}$ Pa in a range of 100° C. to 300° C.

The flexural moduli in the longitudinal direction and lateral direction are, as an example, 35 GPa and 34 GPa, respectively, under normal conditions.

The hot flexural moduli in the longitudinal direction and lateral direction are, as an example, 19 GPa at 250° C. The water absorption ratio is, as an example, 0.13% in a case of being left for 24 hours in an environment at a temperature of 23° C. The dielectric constant is 4.6 at 1 MHz under normal conditions as an example. The dielectric loss tangent is 0.010 at 1 MHz under normal conditions as an example.

[Circuit Pattern Layer 34]

The circuit pattern layer 34 is a metal layer (a copper foil layer as an example) provided over the surface 31 of the insulating substrate 32 and is conductive with the connector 70. The circuit pattern layer 34 has the function of supplying power, which is supplied from a power source (the drive control circuit 80) through the lead wires 71 connected to the connector 70, to the plurality of the light-emitting elements 20.

Therefore, as shown inside the enlarged circle X in FIG. 4, a part of the circuit pattern layer 34 is formed of a plurality of the electrode pairs 34A to which the plurality of the light-emitting elements 20 are each bonded. That is, the circuit pattern layer 34 is connected to each of the light-emitting elements 20.

The plurality of the light-emitting elements 20 are regularly lined up over the entire surface 31 side of the insulating substrate 32, as described above. More specifically, a plurality of serial bodies in which the plurality of the light-emitting elements 20 are connected in series are arranged in a radial shape. Here, each serial body is formed such that the anode side is on the connector 70 side and the cathode side is on the outer circumference side. In accordance with this arrangement of the light-emitting elements 20, the plurality of the electrode pairs 34A are also regularly lined up over the entire surface 31. Below, in the present specification, the portion of the circuit pattern layer 34 other than the plurality of the electrode pairs 34A is referred to as a wiring portion 34B.

The ratio of the surface 31 of the insulating substrate 32 occupied by the circuit pattern layer 34 (the exclusive area of the circuit pattern layer 34) is, for example, 60% or more of the surface 31 of the insulating substrate 32.

The wiring portion 34B extending from the cathode side of the first to eighth parallel bodies 11 to 18 to the connector 70 (GND) is formed to overlap the region where the substrate holding bars 38 shown in FIG. 1 and FIG. 3 are provided and an efficient arrangement of the light-emitting elements 20 is realized.

[Phosphor Layer 36]

The phosphor layer 36 of the present embodiment is provided over the surface 31 of the insulating substrate 32 so as to cover, as an example, portions of the circuit pattern layer 34 other than the plurality of the electrode pairs 34A and the electrical connections described above. In the present embodiment, the ratio occupied by the phosphor layer 36 (the exclusive area of the phosphor layer 36) is 80% or more of the surface 31 of the insulating substrate 32, as an example.

The phosphor layer 36 is, for example, an insulating layer that includes a phosphor (an aggregate of a plurality of phosphor particles) and a binder which are described below, in which the plurality of phosphor particles are dispersed in the binder. The phosphor included in the phosphor layer 36 has the property of exciting the emitted light of each of the light-emitting elements 20 to be excitation light. Specifically, the phosphor of the present embodiment has a property in which the light emission peak wavelength is in the visible light region when the light emission of the light-emitting elements 20 is used as excitation light. The binder may be, for example, an epoxy-based, acrylate-based, or silicone-based binder or the like that has insulating properties equivalent to a binder included in a solder resist.

The phosphor included in the phosphor layer 36 is, as an example, one or more types of phosphor selected from the group consisting of α-type sialon phosphors containing Eu, β-type sialon phosphors containing Eu, CASN phosphors containing Eu, and SCASN phosphors containing Eu. The phosphors described above are examples in the present embodiment and phosphors other than the phosphors described above may also be used, such as YAG, LuAG, BOS, and other phosphors with visible light excitation.

The α-type sialon phosphors containing Eu are represented by General Formula $M_xEu_ySi_{12-(m+n)}Al_{(m+n)}O_nN_{16-n}$. In the General Formula above, M is one or more types of element including at least Ca selected from the group consisting of Li, Mg, Ca, Y, and lanthanide elements (excluding La and Ce) and, when the valence of M is a, ax+2y=m, where x is $0<x\le1.5$, $0.3\le m<4.5$, and $0<n<2.25$.

The β-type sialon phosphor containing Eu is a phosphor in which divalent europium ($Eu^{2+}$) is solid-dissolved as the light-emitting center in β-type sialon represented by General Formula: $Si_{6-z}Al_zO_zN_{8-z}$ (z=0.005 to 1).

In addition, examples of nitride phosphors include CASN phosphors containing Eu, SCASN phosphors containing Eu, and the like.

CASN phosphors containing Eu (an example of nitride phosphors) refer to, for example, a red phosphor represented by the formula $CaAlSiN_3:Eu^{2+}$, in which $Eu^{2+}$ is used as an activator, and a crystal formed of alkali earth silicon nitride is set as the matrix. In the definition of CASN phosphors containing Eu in the present specification, SCASN phosphors containing Eu are excluded.

SCASN phosphors containing Eu (an example of nitride phosphors) refer to, for example, a red phosphor represented by formula $(Sr, Ca)AlSiN_3:Eu^{2+}$, in which $Eu^{2+}$ is used as an activator, and a crystal formed of alkali earth silicon nitride is set as the matrix.

[Rear Surface Pattern Layer]

The rear surface pattern layer (not shown) is a metal layer (a copper foil layer as an example) having a pattern and arranged on the rear surface 33 of the insulating substrate 32. In addition, the rear surface pattern layer is, as an example, an independent floating layer. The rear surface pattern layer overlaps, as an example, 80% or more of the area of the circuit pattern layer 34 arranged on the surface 31 in the thickness direction of the insulating substrate 32. The ratio occupied by the rear surface pattern layer on the rear surface 33 of the insulating substrate 32 (the exclusive area of the rear surface pattern layer) is, as an example, 80% or more of the rear surface 33 of the insulating substrate 32.

<Light-Emitting Operation of the Light-Emitting Device>

Figure 7:
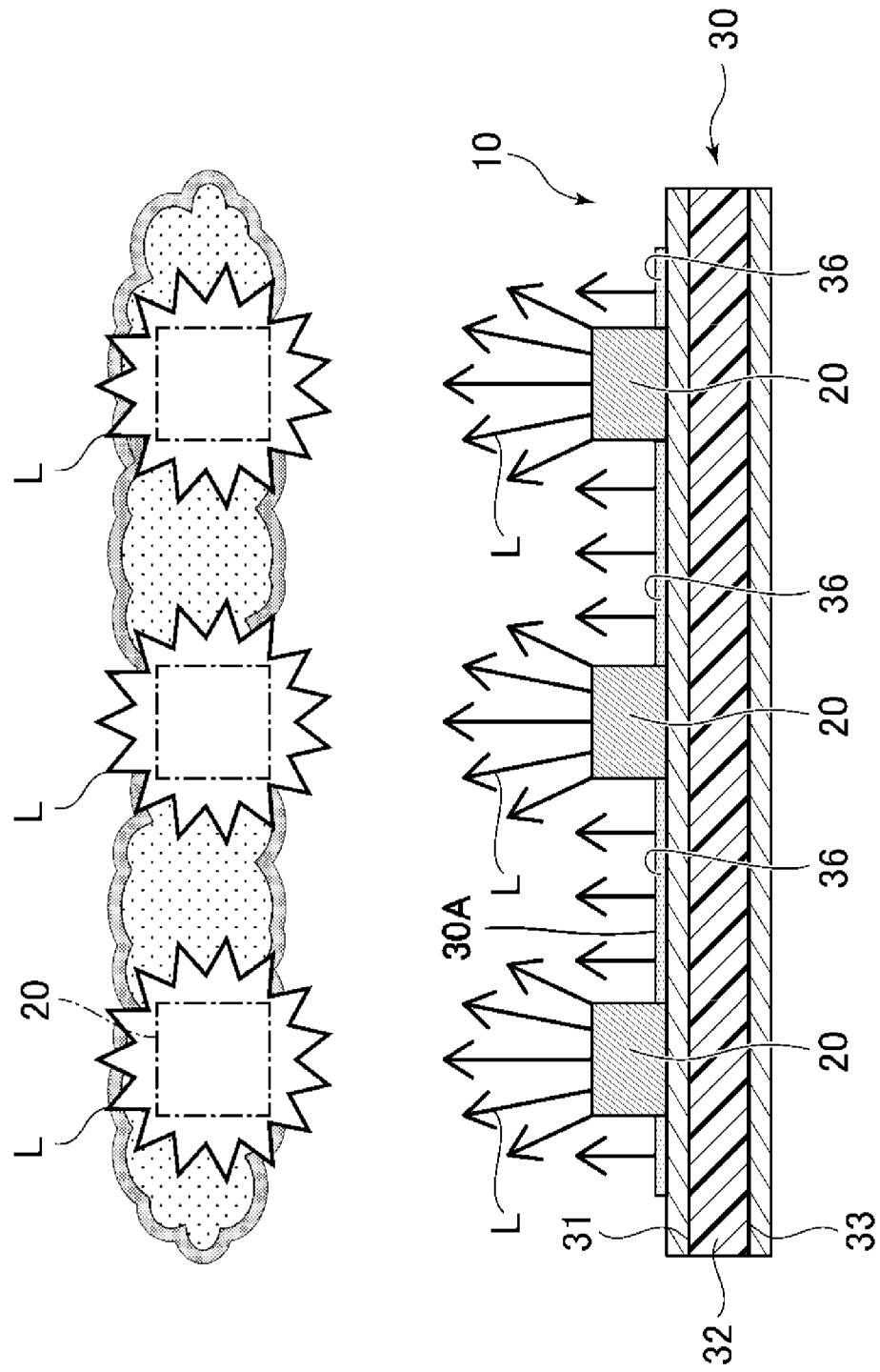
FIG. 7 is a diagram which illustrates a light-emitting operation of the light-emitting substrate of the embodiment.

Next, a description will be given of the light-emitting operation of the light-emitting device 100 of the present embodiment with reference to FIG. 7 and FIG. 8.

When the power source is turned on, the drive control circuit 80 drives the light-emitting elements 20 to emit light. In addition, the drive control circuit 80 supplies power to the cooling fan 50 and performs a temperature detection process using the temperature sensor 75. The drive control circuit 80 carries out feed-back control on the cooling fan 50 to achieve the desired temperature range on the basis of the detection results of the temperature sensor 75.

[Light-Emitting Operation by Light-Emitting Substrate]

The plurality of the light-emitting elements 20 emit light L (refer to FIG. 7) to be divergent in a radial shape and a part of the light L reaches the surface 30A of the phosphor substrate 30. A description will be given below of the behavior of the light L, divided into the directions in which the emitted light L travels.

A part of the light L emitted from each of the light-emitting elements 20 is emitted outside the housing 60 without being incident to the phosphor layer 36. In such a case, the wavelength of the light L remains the same as the wavelength of the light L when emitted from each of the light-emitting elements 20.

In addition, the light of the flip chip LED itself in a part of the light L emitted from each of the light-emitting elements 20 is incident to the phosphor layer 36. Here, the "light of the flip chip LED itself in a portion of the light L" refers to light in the emitted light L that is not color-converted by the phosphor of each of the light-emitting elements 20 (the CSP itself), that is, the light of the flip chip LED itself (as an example, blue light (with a wavelength in the vicinity of 470 nm)).

When the light L of the flip chip LED itself hits the phosphor dispersed in the phosphor layer 36, the phosphor is excited and emits excitation light. Here, the reason why the phosphors are excited is because the phosphors dispersed in the phosphor layer 36 use phosphors (visible light excitation phosphors) having an excitation peak in blue light.

Accordingly, some of the energy of the light L is used to excite the phosphors, whereby the light L loses some energy. As a result, the wavelength of the light L is converted (wavelength conversion is performed). For example, depending on the type of phosphor in the phosphor layer 36 (for example, in a case where red CASN is used as the phosphor), the wavelength of the light L becomes longer (for example, 650 nm or the like).

In addition, the excitation light in the phosphor layer 36 may be emitted from the phosphor layer 36 as it is, but a part of the excitation light is directed to the circuit pattern layer 34 (refer to FIG. 4) on the lower side.

The excitation light directed to the circuit pattern layer 34 is emitted to the outside due to reflection by the circuit pattern layer 34. For example, in a case where the wavelength of the excitation light by the phosphor is 600 nm or longer, a reflection effect may be expected even when the circuit pattern layer 34 is Cu. In a case where the wavelength of the excitation light is less than 600 nm, a reflection effect may be expected when the circuit pattern layer 34 or the surface thereof is, for example, Ag (plated).

Depending on the type of phosphor in the phosphor layer 36, the wavelength of the light L may differ from the example described above, but in any case, the light L is subjected to wavelength conversion.

As described above, the light L emitted by each of the light-emitting elements 20 (the light L emitted in a radial shape by each of the light-emitting elements 20) is radiated to the outside together with the excitation light described above through a plurality of optical paths as described above. Therefore, in a case where the light emission wavelength of the phosphor included in the phosphor layer 36 and the light emission wavelength of the phosphor sealing (or covering) the flip chip LED in the light-emitting element 20 (CSP) are different, the light-emitting substrate 10 of the present embodiment radiates, together with the excitation light described above, a bundle of the light L when each of the light-emitting elements 20 carries out the emission, so as to be a bundle of the light L which includes the light L of a wavelength different from the wavelength of the light L when emitted by each of the light-emitting elements 20. For example, the light-emitting substrate 10 of the present embodiment radiates a composite light of the light (wavelength) emitted by the light-emitting elements 20 and the light (wavelength) emitted from the phosphor layer 36.

In contrast, in a case where the light emission wavelength of the phosphor included in the phosphor layer 36 and the light emission wavelength of the phosphor sealing (or covering) the flip chip LED in the light-emitting element 20 (CSP) are the same (in a case of the same correlated color temperature), the light-emitting substrate 10 of the present embodiment radiates, together with the excitation light described above, a bundle of the light L when each of the light-emitting elements 20 carries out emission, as a bundle of the light L including light L of the same wavelength as the wavelength of the light L when emitted by each of the light-emitting elements 20.

In addition, the case of the present embodiment (refer to FIG. 7) is different from a case without the phosphor layer 36 (refer to FIG. 8) in that light also radiates from the phosphor layer 36 and thus the glare of the radiated light is reduced.

In the case of the present embodiment, the phosphor layer 36 covers the entire surface 31 side of the insulating substrate 32. In addition, a part of the light emitted from each of the light-emitting elements 20 generates heat when incident to the phosphor layer 36 to thereby cause excitation. The generated heat is discharged to the outside by the heat sink 40 and the cooling fan 50 described above.

The above is a description of the light-emitting operation according to the light-emitting substrate 10.

Effects of Embodiment

A description will be given below of the characteristics and effects of the present embodiment.

(1) The light-emitting device 100 has the light-emitting substrate 10 having a circuit pattern layer 34 provided over one surface (here, the surface 31) of an insulating substrate 32 and a plurality of the light-emitting elements 20 bonded to the circuit pattern layer 34, in which the light-emitting substrate 10 has a phosphor layer 36 provided on one surface side (that is, the surface 31 side) of the insulating substrate 32 and including a phosphor in which the light emission peak wavelength is in the visible light region when the light emission of at least one of the light-emitting elements 20 is used as excitation light, the plurality of the light-emitting elements 20 have a plurality of serial bodies (here, the first to fifth serial bodies 21 to 25) in which a plurality of the light-emitting elements 20 are connected in series, and are arranged in parallel from the inner side of the substrate surface to the outer side of the substrate surface when the substrate surface of the light-emitting substrate 10 is viewed from the top surface, and the anode side of the plurality of the serial bodies is arranged on the same side as either the inner side of the substrate surface or the outer side of the substrate surface.

That is, a plurality of serial bodies in which light-emitting elements 20 are connected in series are provided. In the serial bodies, the anode side is arranged on the same side as either the inner side of the substrate surface (center side) or the outer side of the substrate surface (peripheral side). In the embodiment described above, the anode side is arranged on the center side of the substrate outline of the light-emitting substrate 10 (phosphor substrate 30) viewed from the top surface and the ground side is arranged on the outer edge side of the substrate outline. Accordingly, since the anode sides of the plurality of the serial bodies are concentrated on either the inner side of the substrate surface (center side) or the outer side of the substrate surface (periphery side), the degree of freedom in the wiring and mounting of the light-emitting elements 20 is improved. That is, the connectors 70 connected to the serial bodies may be concentrated in the center of the substrate. In particular, as in the embodiment described above, the effect described above is particularly remarkable in a case where the anode side is arranged to the inner side of the substrate surface (center side) and the cathode side (ground side) is arranged to the outer side of the substrate surface (periphery side). That is, for the ground (GND), for example, an enclosure may be set as a common ground (a so-called chassis GND) for the plurality of the serial bodies for which there is inherently a high degree of freedom in design. However, it is necessary for the anode side to be connected to the drive control circuit 80. Accordingly, when the anode side of the serial body is on the outer edge side of the light-emitting substrate 10, the arrangement of the connectors 70 and the routing of the lead wires 71 extending from the connectors 70 become complicated, the degree of freedom in the arrangement of the 20 light-emitting elements is decreased as a result, and it is difficult to realize a high output light-emitting device 100. However, according to the present embodiment, as described above, there is no such concern, the efficiency and concentration of the arrangement of the light-emitting elements 20 may further be improved, and the light-emitting device 100 with a high output (high brightness) may be realized.

(2) A parallel body (here, the first to fourth parallel bodies 11 to 14) in which at least some of the serial bodies are connected in parallel with each other may be present.

By having a configuration in which serial bodies of the light-emitting elements 20 are connected in a parallel body, the connectors 70 and the lead wires 71 may be provided and an efficient circuit structure may be realized.

(3) A plurality of the parallel bodies may be provided.

The connectors 70 and lead wires 71 may be provided and an efficient circuit structure may be realized.

(4) Each of the parallel bodies (here, the first to fourth parallel bodies 11 to 14) may have a different light-emitting color. That is, the light-emitting elements 20 may be different for each parallel body.

Due to this, multi-colored lighting may be realized and, by adjusting the output of each parallel body, a variety of lighting colors may be output.

(5) For each of the parallel bodies (here, first to fourth parallel bodies 11 to 14), the light emission peak wavelength of the phosphor layer 36 in the region where the parallel body is provided (here, the first to fourth substrate regions 10A to 10D) may be set.

The fluorescent color of the phosphor layer 36 in at least one parallel body region is different from the fluorescent color of other parallel body regions. By adjusting the output of the light-emitting elements 20, the lighting color as the light-emitting device 100 may be adjusted. In addition, in a case where the light-emitting elements 20 have different light-emitting colors as in (4), an even greater variety of lighting colors may be realized.

(6) The serial bodies described above (the first to fifth serial bodies 21 to 25) may be provided in a radial shape.

Due to this, the light-emitting elements 20 (in particular, the serial bodies) may be efficiently arranged.

(7) The light-emitting substrate 10 (in other words, the phosphor substrate 30) may have a substantially circular outer shape.

It is easy to make the arrangement of the light-emitting elements 20, that is, the distribution of the light emission amount, uniform, that is, to adjust the light emission amount.

(8) The connector 70, which is provided on the center side of the radial shape presented by the light-emitting substrate 10, and which is connected to the serial body, and the lead wire 71 connected to the connector 70 and used to supply power to the serial body, may be provided.

Since the serial bodies of the light-emitting elements 20 are provided in a radial shape, the connectors 70 in the center of the radial shape, that is, in the central region of the circle, may be concentrated, which makes it easier to concentrate the lead wires 71 connected to the connectors 70.

(9) The light-emitting substrate 10 has an open hole (here, the central open hole 37) that penetrates the central region of the radial shape in the substrate thickness direction.

The lead wires 71 connected to the connectors 70 may be connected through the open hole (the central open hole 37) to the drive control circuit 80 of the light-emitting elements 20 provided inside the enclosure.

Since the lead wires 71 are drawn through the central open hole 37 in the immediate vicinity of the connector 70 and into the housing 60, the routing of the lead wires 71 is not complicated and a simple structure may be realized.

(10) The light-emitting substrate 10 may further have the temperature sensor 75.

By having the temperature sensor 75 particularly near the center of the substrate, that is, in the vicinity of the central open hole 37, the signal lines (lead wires) connected to the temperature sensor 75 may be routed integrally with the lead wires 71 connected to the connector 70 (that is, the light-emitting elements 20).

(11) The light-emitting substrate may further have a heat-dissipating unit (here, the heat sink 40 or the cooling fan 50 or the like) to dissipate the heat of the light-emitting substrate, which rises in temperature due to the light emission of the light-emitting element 20.

Although the present invention was described above with each of the embodiments described above as examples, the present invention is not limited to each of the embodiments described above. Any form that has at least a configuration that achieves the first effect described above is included in the technical scope of the present invention.

This application claims priority based on Japanese Patent Application No. 2020-142373 filed on Aug. 26, 2020, the entire disclosure of which is incorporated herein.

REFERENCE SIGNS LIST

10: light-emitting substrate
10A to 10D: first to fourth substrate regions
11 to 18: first to eighth parallel bodies 20: light-emitting element
30: phosphor substrate
30A, 31: surface
30B, 33: rear surface
32: insulating substrate
34: circuit pattern layer
34A: electrode pair
34B: wiring portion
36: phosphor layer
37: terminal
39: through hole
40: heat sink
50: cooling fan
60: housing
62: peripheral wall
64: bottom wall
66: top wall
69: cooling opening
75: temperature sensor
80: drive control circuit
100: light-emitting device
L: light

The invention claimed is:

1. A light-emitting device comprising:
a light-emitting substrate having a circuit pattern layer provided over one surface of an insulating substrate and a plurality of light-emitting elements bonded to the circuit pattern layer, wherein
the light-emitting substrate has a phosphor layer which is provided on one surface side of the insulating substrate and which includes a phosphor in which a light emission peak wavelength is in a visible light region when light emitted from at least one of the light-emitting elements is used as excitation light,
the plurality of the light-emitting elements have a plurality of serial bodies in which the plurality of the light-emitting elements are connected in series,
the plurality of the serial bodies are arranged in parallel from an inner side of a substrate surface to an outer side of the substrate surface when the substrate surface of the light-emitting substrate is viewed from a top surface,
anode sides of the plurality of the serial bodies are arranged on a same side as either the inner side of the substrate surface or the outer side of the substrate surface, and
the phosphor layer does not seal or cover the plurality of the light-emitting elements.

2. The light-emitting device according to claim 1, further comprising:
a parallel body in which at least some of the serial bodies are connected in parallel with each other,
wherein the plurality of the light-emitting elements are provided on a same insulating substrate.

3. The light-emitting device according to claim 2,
wherein a plurality of parallel bodies are provided.

4. The light-emitting device according to claim 3,
wherein each of the parallel bodies has a different light-emitting color.

5. The light-emitting device according to claim 2,
wherein the light emission peak wavelength of the phosphor layer in a region where the parallel body is provided is set for each of a plurality of parallel bodies.

6. The light-emitting device according to claim 1, wherein
the serial bodies are provided in a radial shape, and
the plurality of the light-emitting elements are provided on a same insulating substrate.

7. The light-emitting device according to claim 1,
wherein the light-emitting substrate is substantially circular in outline.

8. The light-emitting device according to claim 1, further comprising:
a connector which is connected to the serial bodies and which is provided on a center side of a radial shape of the light-emitting substrate; and
a lead wire which is for supplying power to the serial bodies and which is connected to the connector.

9. The light-emitting device according to claim 1, wherein
the light-emitting substrate has an open hole penetrating a central region in a radial shape and is connected through the open hole to a drive control circuit of the light-emitting elements, which is provided inside an enclosure, and
the plurality of the light-emitting elements are provided on a same insulating substrate.

10. The light-emitting device according to claim 1,
wherein the light-emitting substrate further has a temperature sensor.

11. The light-emitting device according to claim 1, further comprising:
a heat-dissipating unit dissipating heat of the light-emitting substrate that rises in temperature due to light emission from the light-emitting elements.

* * * * *